(12) United States Patent
Joshi et al.

(10) Patent No.: US 7,582,956 B2
(45) Date of Patent: *Sep. 1, 2009

(54) FLIP CHIP IN LEADED MOLDED PACKAGE AND METHOD OF MANUFACTURE THEREOF

(75) Inventors: Rajeev Joshi, Cupertino, CA (US); Consuelo N. Tangpuz, Lapulapu City Cecebu (PH); Romel N. Manatad, Mandaue City (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/693,141

(22) Filed: Mar. 29, 2007

(65) Prior Publication Data

US 2008/0036056 A1 Feb. 14, 2008

Related U.S. Application Data

(60) Continuation of application No. 11/213,182, filed on Aug. 25, 2005, now Pat. No. 7,215,011, which is a continuation of application No. 10/607,633, filed on Jun. 27, 2003, now Pat. No. 6,949,410, which is a division of application No. 09/464,885, filed on Dec. 16, 1999, now Pat. No. 6,720,642.

(51) Int. Cl.
*H01L 23/495* (2006.01)

(52) U.S. Cl. ............ 257/673; 257/666; 257/737; 257/779; 257/780; 257/E23.129

(58) Field of Classification Search ........ 257/685, 257/673, E23.129

See application file for complete search history.

(56) References Cited

U.S. PATENT DOCUMENTS

| 4,678,358 A | 7/1987 | Layher |
| 5,105,536 A | 4/1992 | Neugebauer et al. |
| 5,147,821 A | 9/1992 | McShane et al. |
| 5,183,724 A * | 2/1993 | Johnson ............ 430/312 |
| 5,250,841 A | 10/1993 | Sloan et al. |

(Continued)

FOREIGN PATENT DOCUMENTS

JP 1-134958 5/1989

(Continued)

OTHER PUBLICATIONS

"IR'S New Synchronous Rectifier Chip Set Meets New Efficiency Standard for DC-DC Converters to Power Notebook PC Processors through 2000." International Rectifier Company Information. Retrieved from the World Wide Web on Sep. 9, 2003 at http://www.irf.com/whats-new/nr990402.html.

*Primary Examiner*—Sue Purvis
*Assistant Examiner*—Krista Soderholm
(74) *Attorney, Agent, or Firm*—Townsend and Townsend and Crew LLP

(57) ABSTRACT

A chip device that includes a leadframe, a die and a mold compound. The backside of the die is metallized and exposed through a window defined within a mold compound that encapsulates the die when it is coupled to the leadframe. Leads on the leadframe are coupled to source and gate terminals on the die while the metallized backside of the die serves as the drain terminals.

9 Claims, 11 Drawing Sheets

U.S. PATENT DOCUMENTS

| | | | |
|---|---|---|---|
| 5,319,242 | A | 6/1994 | Carney et al. |
| 5,347,709 | A | 9/1994 | Maejima et al. |
| 5,554,569 | A | 9/1996 | Ganesan et al. |
| 5,654,206 | A | 8/1997 | Merrill |
| 5,723,900 | A | 3/1998 | Kojima et al. |
| 5,811,879 | A | 9/1998 | Akram |
| 6,018,686 | A | 1/2000 | Orso et al. |
| 6,198,163 | B1 | 3/2001 | Crowley et al. |
| 6,214,640 | B1 | 4/2001 | Fosberry et al. |
| 6,215,176 | B1 | 4/2001 | Huang |
| 6,239,367 | B1 * | 5/2001 | Hsuan et al. ............... 174/528 |
| 6,249,041 | B1 | 6/2001 | Kasem |
| 6,307,755 | B1 * | 10/2001 | Williams et al. ............ 361/813 |
| 6,319,755 | B1 | 11/2001 | Mauri |
| 6,384,492 | B1 | 5/2002 | Iversen et al. |
| 6,388,336 | B1 | 5/2002 | Venkateshwaran et al. |
| 6,399,418 | B1 | 6/2002 | Glenn et al. |
| 6,423,623 | B1 | 7/2002 | Bencuya |
| 6,429,509 | B1 | 8/2002 | Hsuan |
| 6,448,110 | B1 | 9/2002 | Chen et al. |
| 6,452,278 | B1 | 9/2002 | DiCaprio et al. |
| 6,528,880 | B1 | 3/2003 | Planey |
| 6,744,124 | B1 | 6/2004 | Chang |
| 6,989,588 | B2 | 1/2006 | Quinones et al. |
| 7,215,011 | B2 | 5/2007 | Joshi et al. |
| 2003/0025183 | A1 | 2/2003 | Thornton et al. |
| 2004/0201086 | A1 | 10/2004 | Joshi |
| 2005/0167848 | A1 | 8/2005 | Joshi |
| 2006/0151861 | A1 | 7/2006 | Noquil et al. |
| 2006/0220241 | A1 | 10/2006 | Thornton et al. |

FOREIGN PATENT DOCUMENTS

| | | |
|---|---|---|
| WO | WO 91/00617 A1 | 1/1991 |
| WO | WO 99/65077 A1 | 12/1999 |

* cited by examiner

FLIP CHIP IN LEADED MOLDED PACKAGE AND METHOD OF MANUFACTURE THEREOF

CROSS-REFERENCES TO RELATED APPLICATIONS

This application is a continuation of U.S. patent application Ser. No. 11/213,182, filed on Aug. 25, 2005 now U.S. Pat. No. 7,215,011, which is a continuation application of U.S. patent application Ser. No. 10/607,633 Jun. 27, 2003 now U.S. Pat. No. 6,949,410, which is a divisional of U.S. patent application Ser. No. 09/464,885, filed on Dec. 16, 1999, now U.S. Pat. No. 6,720,642. These applications are herein incorporated by reference in their entirety for all purposes.

BACKGROUND OF THE INVENTION

1. Field of the Invention

The present invention relates to an improved package and method of packaging for a flip chip, and more particularly, to a flip chip wherein a die is attached to a leadframe that is then placed within a thinner package such that the back side of the die is exposed.

2. Description of the Prior Art

In power transistor packages, those in the art are generally still using chip and wire bond interconnect technology. It is difficult to simplify the manufacturing process flow as all process steps, such as, for example, die attach, wire bond, and molding are required. As a result, there is a limit placed on the maximum size for the die. Thus, power transistor packages are suited for single die applications since formation of an isolated metal pad for power transistor packages that include multiple dies is very difficult.

Recent attempts to improve packaging of chip devices have included directly coupling lead frames to the die. However, this technology does not lend itself well to the manufacture of thinner outline (or profile) packages. Hence, such packages, as well as those using wire bond interconnect technology, tend to be thick.

SUMMARY OF THE INVENTION

The present invention provides a chip device that includes a leadframe including a plurality of leads and a die coupled to the leadframe. The die includes a metallized back side as well as source and gate terminals opposite the metallized backside. The die is coupled to the leadframe such that the leads of the leadframe are directly coupled to the terminals. The chip device also includes a body including a window defined therein. The body is placed around at least a portion of the leadframe and the die such that the metallized back side of the die is adjacent the window.

In accordance with one aspect of the present invention, the die is coupled to the leadframe with solder bumps.

In accordance with another aspect of the present invention, the chip device includes two dies.

In accordance with a further aspect of the present invention, a method of making a chip device includes providing a leadframe including a plurality of leads and a die attach pad and post, coupling a die to the die attach pad and post and, encapsulating at least a portion of the leadframe and die such that a metallized back side of the die is adjacent a window defined within the package mold.

In accordance with another aspect of the present invention, the method includes configuring leads of the leadframe.

In accordance with another aspect of the present invention, the configuring of the leads includes removing mold flashes and resins from the leads, removing dambars, and solder plating the leads.

In accordance with a further aspect of the present invention, the leadframe is provided with preplated leads.

In accordance with yet another aspect of the present invention, the leadframe is provided with preplated leads and preformed leads.

In accordance with a further aspect of the present invention, the leadframe is provided with two die attach pads and posts, wherein a first die is coupled to a first die attach pad and post, and a second die is coupled to a second die attach pad and post.

In accordance with another aspect of the present invention, the die is coupled to the leadframe die attach pad and post via solder bumps, wherein the solder bumps are re-flowed.

Thus, the present invention provides a chip device that includes a thinner package, yet can accommodate a larger die. Indeed, up to a 70% increase in die area over wire bonded parts may be realized. Additionally, the present invention lends itself to packaging multiple dies in the same package. The present invention allows a die-to-die connection to be achieved using a low resistance path (leadframe based) capable of carrying high current. Furthermore, the present invention provides a simplified manufacturing process, especially in the embodiments where preplated and preformed leadframes are provided.

Other features and advantages of the present invention will be understood upon reading and understanding the detailed description of the preferred exemplary embodiments, found hereinbelow, in conjunction with reference to the drawings, in which like numerals represent like elements.

DETAILED DESCRIPTION OF THE PREFERRED EXEMPLARY EMBODIMENTS

Figure 1A:
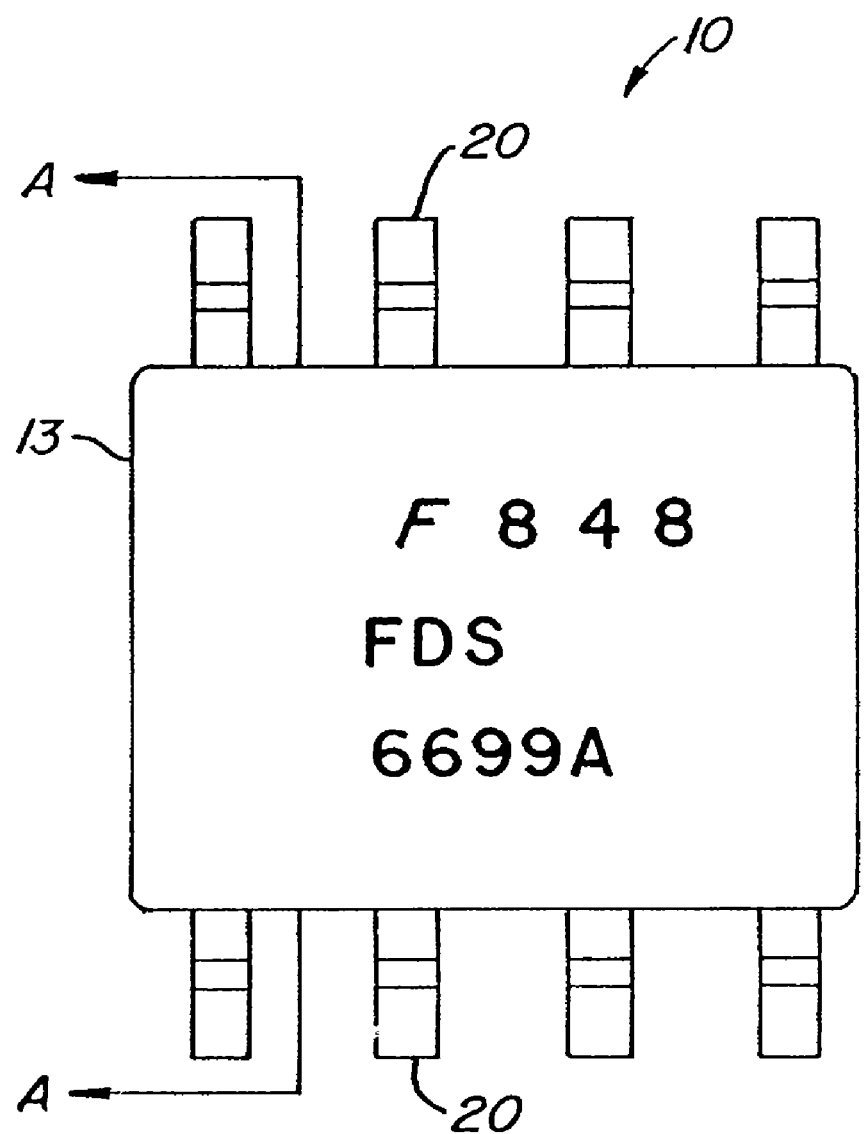
FIG. 1A is a top plan view of a chip device in accordance with the present invention.
Figure 1B:
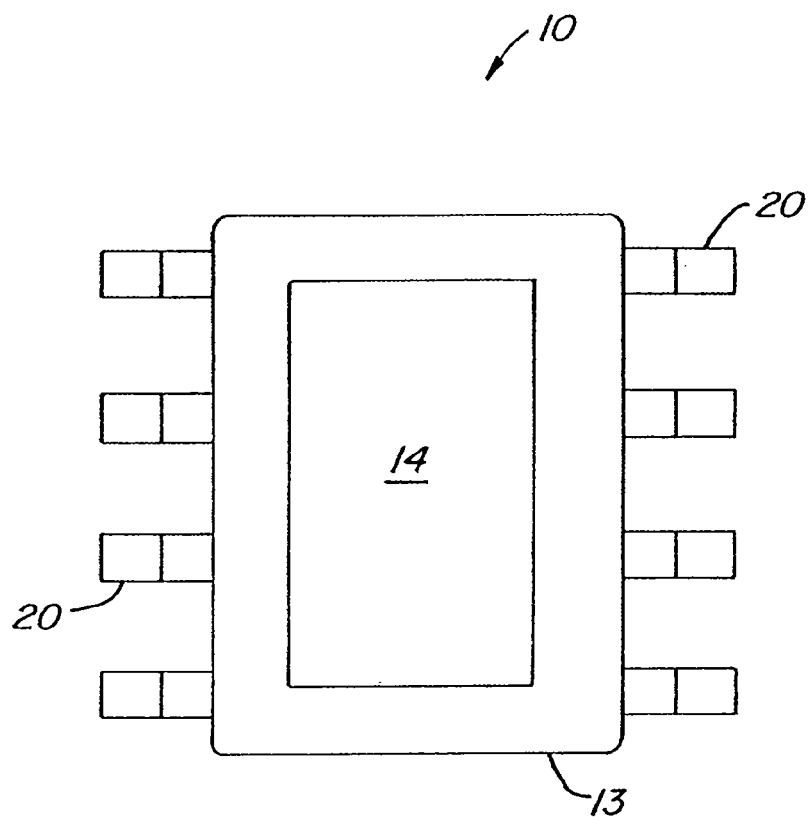
FIG. 1B is a bottom elevation view of a chip device in accordance with the present invention.

A chip device or semiconductor device 10 includes a leadframe 11, a chip or die 12 and a mold compound or body 13. Preferably, backside 14 of the die is metallized.

Figure 2:
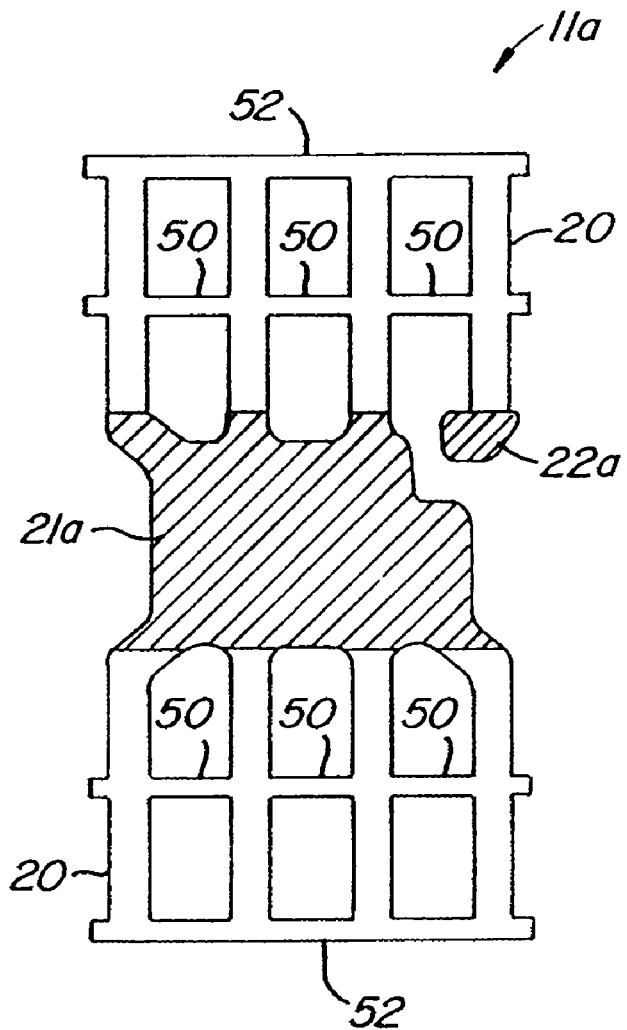
FIG. 2 is a top plan view of a leadframe for use in making a chip device in accordance with the present invention.
Figure 3:
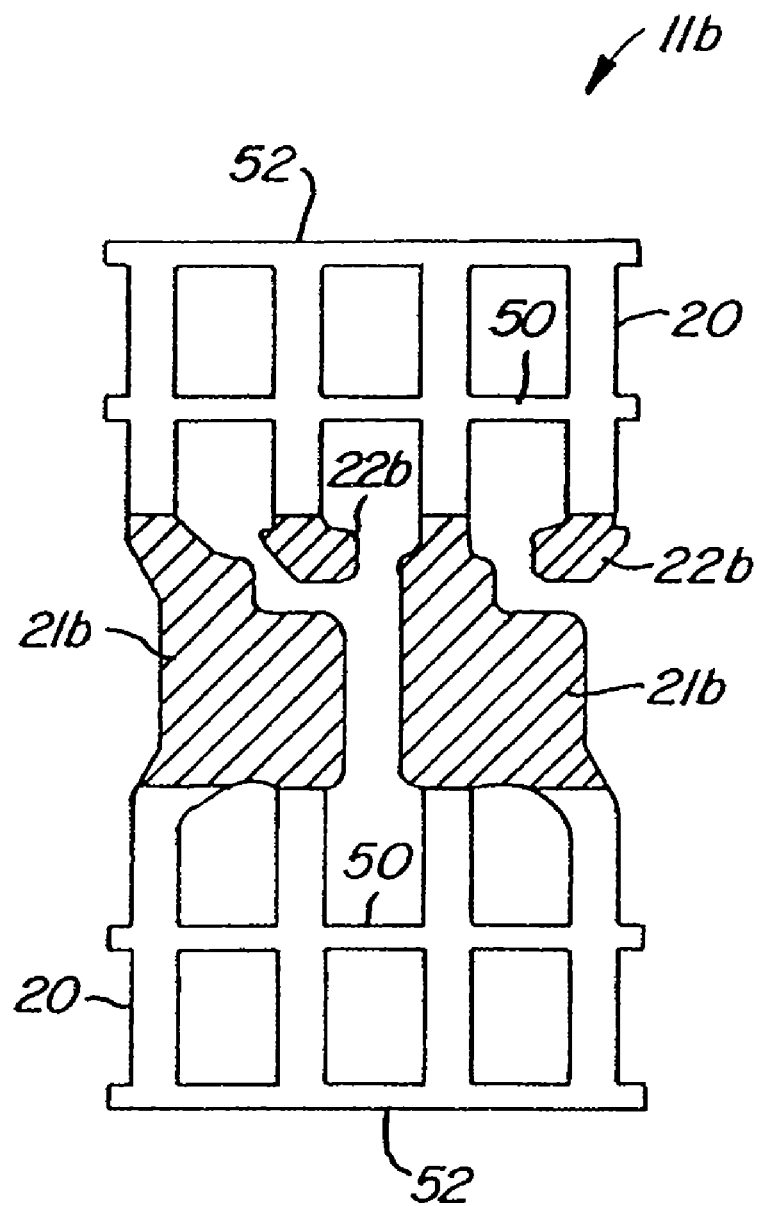
FIG. 3 is a top plan view of an alternative leadframe for use in making a chip device in accordance with the present invention.

FIG. 2 illustrates a leadframe 11a including a plurality of leads 20 and a die attach pad 21a and post 22a. Preferably, the leadframe consists of a copper base and is either silver plated or nickel plated on the die attach pad and post. FIG. 3 illustrates a leadframe 11b similar to leadframe 11a. Leadframe 11b includes two die attach pads and posts 22b and thus is used for a chip device that includes two chips or dies. Thus, chip devices with multiple dies may be made. While FIG. 3 illustrates two die attach pads, it should be readily apparent to those skilled in the art that leadframes with more than two die attach pads may be used, and hence, chip devices with more than two dies may be made.

Figure 3A:
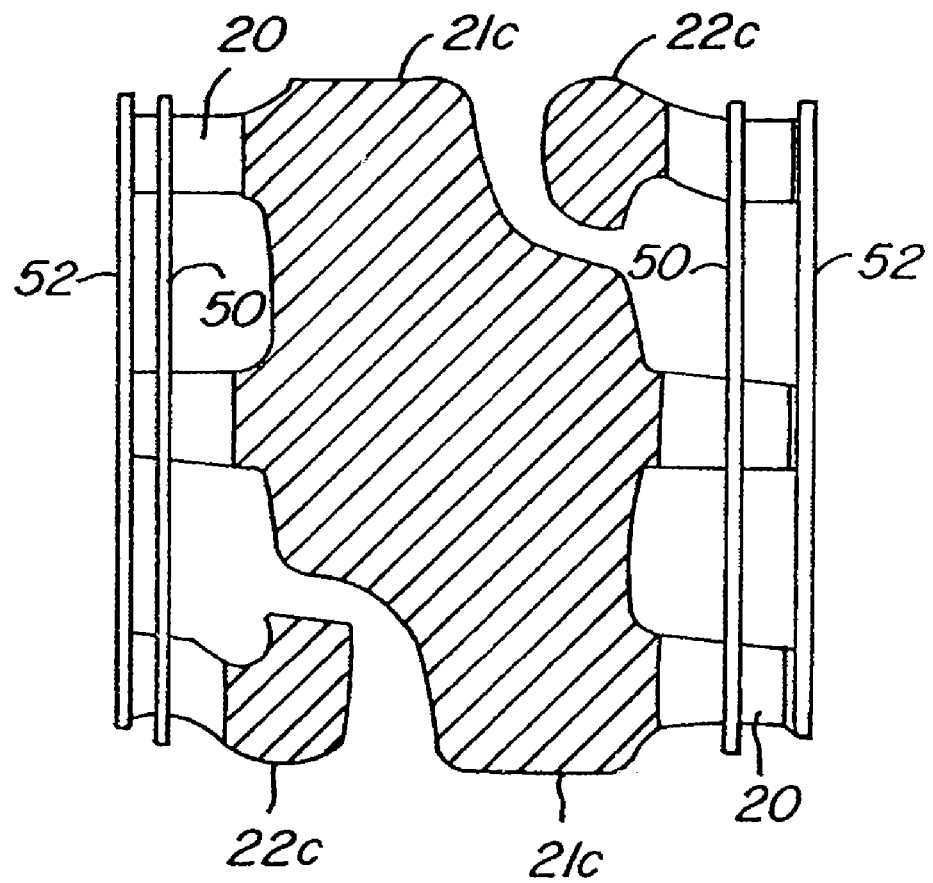
FIG. 3A is a top plan view of the leadframe illustrated in FIG. 3 a common die attach pad for two dies.

FIG. 3A illustrates leadframe 11c that includes a common die attach pad 21c for two dies thus providing a die-to-die connection. By using such a leadframe to couple two dies, a low resistance path capable of carrying high current is achieved. For example, in MOSFET devices, this allows bi-directional switches to be fabricated (common source contact).

Figure 4:
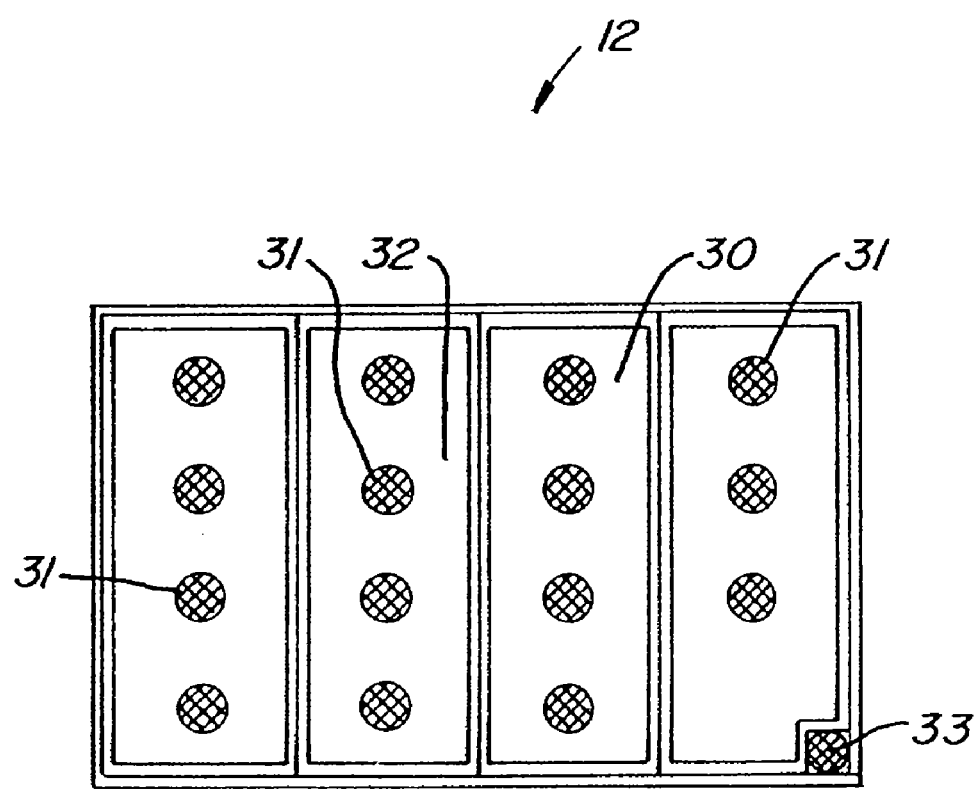
FIG. 4 is a top plan view of a die for use in making a chip device in accordance with the present invention.

FIG. 4 illustrates a die or chip 12. As noted above, back surface 14 of the die is preferably back metallized. Preferably, top surface 30 of the die is passivated and includes a plurality of solder bumps 31. Most of the solder bumps will serve to connect source region 32 of the chip to leads of the leadframe. Solder bump 33 serves as a gate bump and thus couples gate region 34 of the chip to a gate lead of the leadframe via die attach post 22.

Once the chip with the array of solder bumps is brought into contact with the die attach pad and post, the solder is reflowed, preferably with heat, in order to attach the chip to the leadframe and to provide good contact between the chip and the leadframe.

Once the solder has been reflowed, the chip device is encapsulated with mold compound 13 such that the chip and the die attach pad and post are enveloped by the mold compound.

Figure 1C:
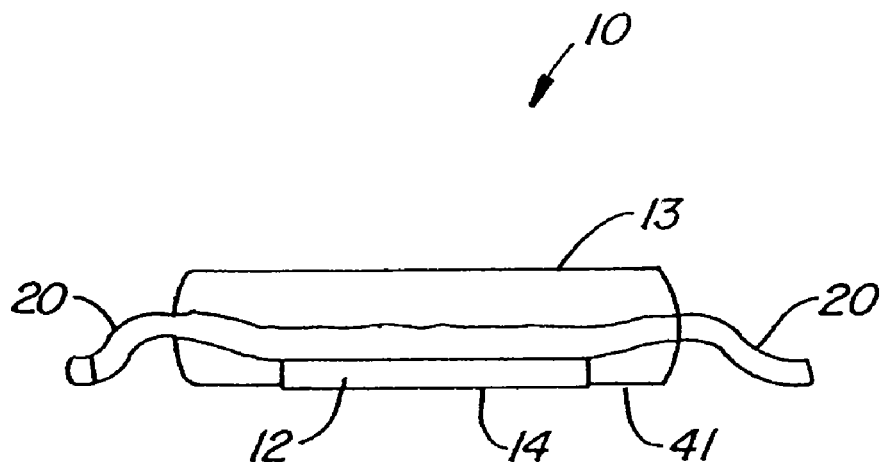
FIG. 1C is a sectional view of a chip device in accordance with the present invention as seen along the line A-A in FIG. 1A.
Figure 1D:
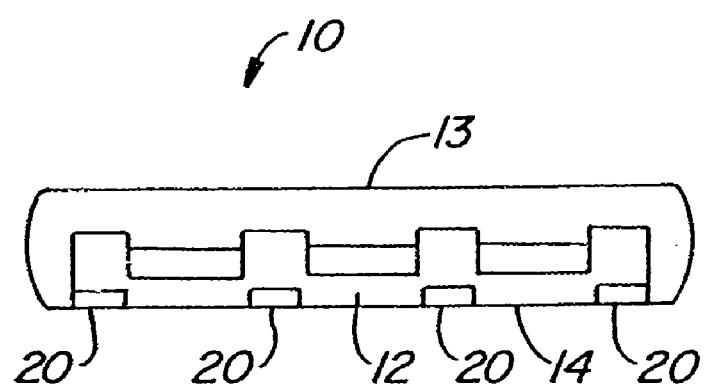
FIG. 1D is a side elevation view of a chip device in accordance with the present invention.
Figure 5:
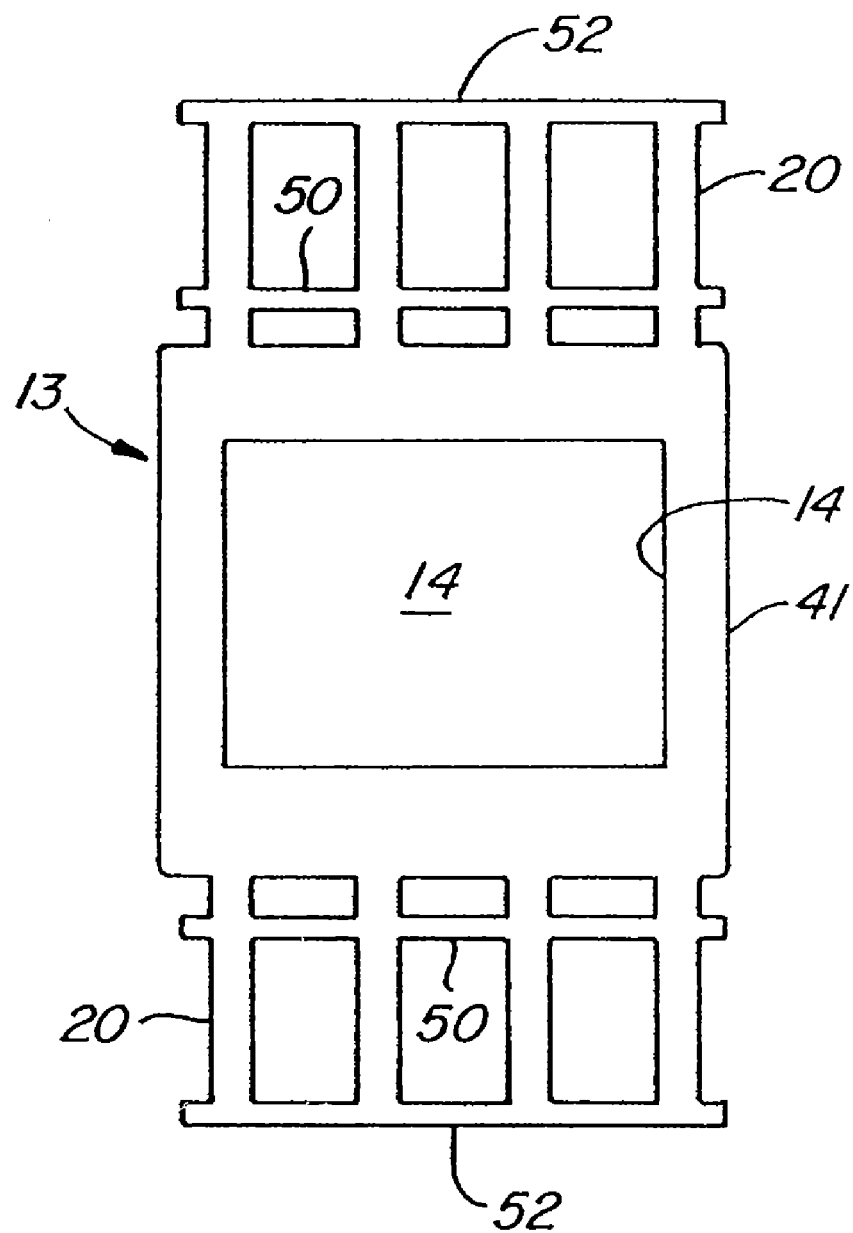
FIG. 5 is a bottom plan view of a die coupled to a leadframe and encapsulated with a mold compound.

As can be seen in FIG. 5, mold compound 13 includes a window 40 defined therein. The chip device is encapsulated by the mold compound such that metallized back surface 14 of the die is adjacent to the window. Preferably, as can be seen in FIG. 1C, metallized back surface 14 is at least partially within window 40 such that back surface 14 is substantially flush with back surface 41 of mold compound 13. Thus, after encapsulating the chip device with the mold compound, the metallized back surface of the die is exposed through the window. When the chip device is placed on a circuit board for use, this exposed back surface of the die serves as the drain terminal of the chip device.

Figure 6:
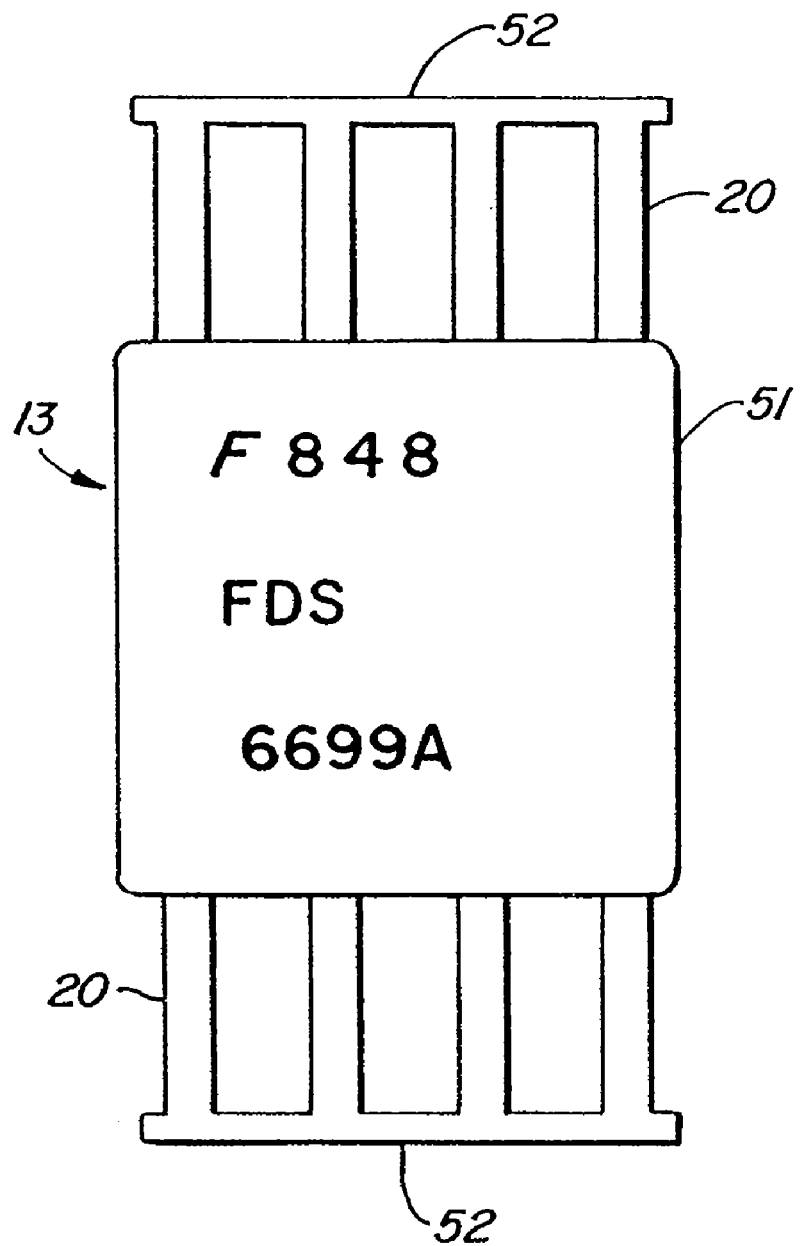
FIG. 6 is a top plan view of a old compound encapsulating a die coupled to a leadframe with dambars removed and marking on the mold compound.

Once mold compound 13 has been added to the chip device, the "package" of the chip device is essentially complete. Dambars 50 are removed and the leads are cleansed of any mold flashes and resins that may have accumulated during the manufacturing process. If desired, top surface 51 of the mold compound opposite the surface that includes the window may be marked with a laser or ink as shown in FIG. 6, for example, to identify the chip device. The leads are then solder plated and rails 52 at the end of the leads are removed. The leads are then configured by bending or forming them so that the chip may be placed on a circuit board. As can be seen in FIG. 1C, the leads are configured so that the ends are essentially co-planer with the exposed back surface 14 of the die.

In accordance with an alternative manufacturing process, the leadframe is pre-plated prior to the start of the manufacturing process. Preferably, the leadframe is pre-plated with NiPd. The manufacturing process proceeds as described above except the step of solder plating the leads is no longer required.

Figure 7A:
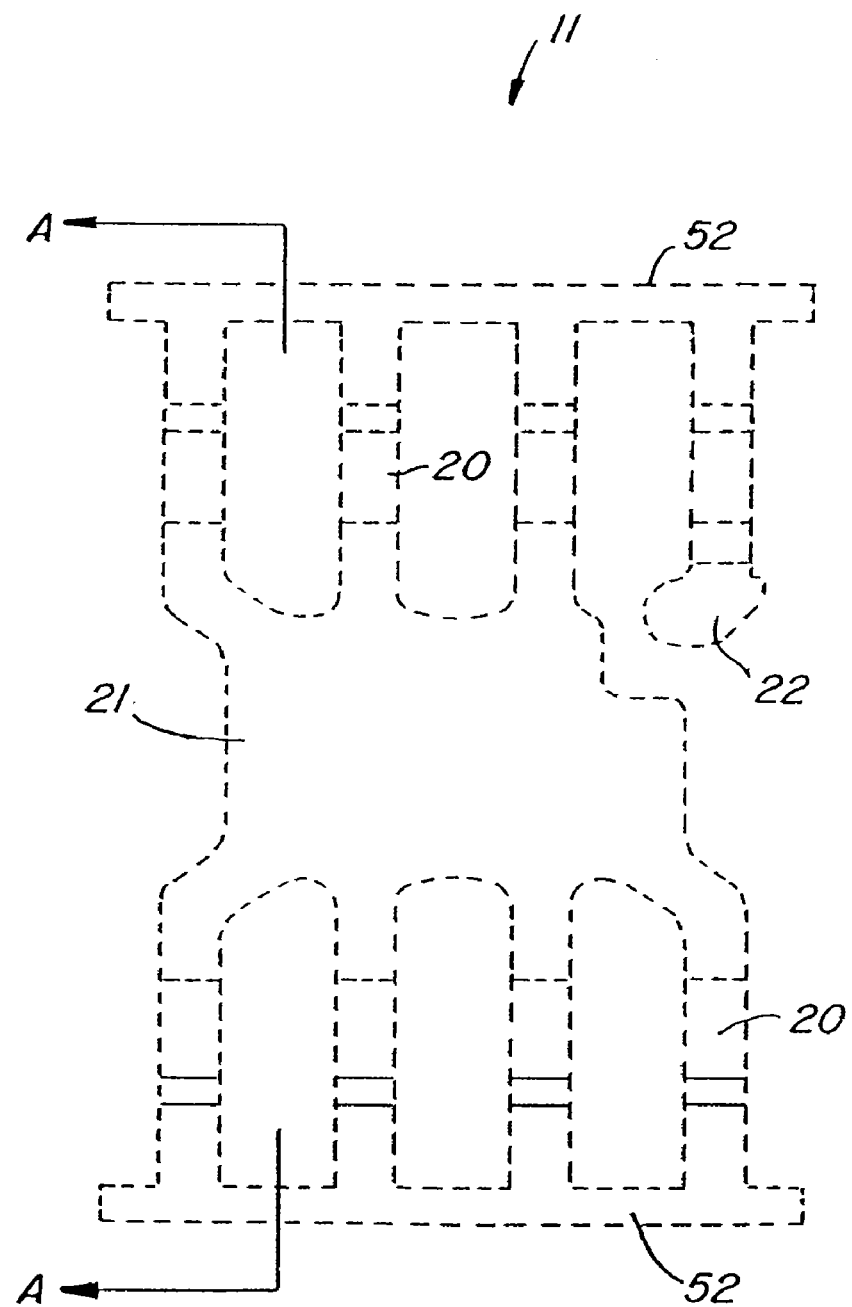
FIG. 7A is a top plan view of a preplated and preformed leadframe in accordance for making a chip device in accordance with an alternative embodiment of the present invention.
Figure 7B:
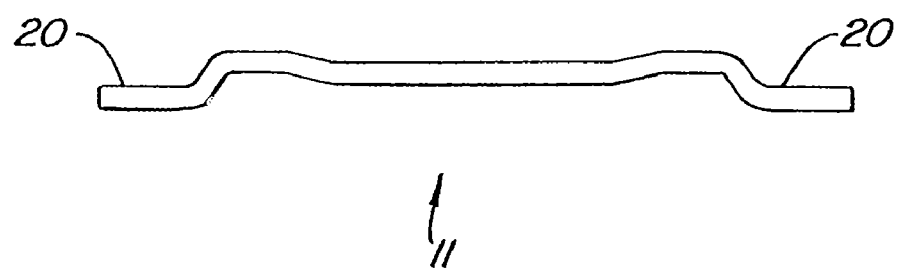
FIG. 7B is a sectional view of the leadframe illustrated in FIG. 7A as seen along the line A-A.

Additionally, in accordance with yet another embodiment of the manufacturing process, the leads of the leadframe are "pre-formed." Preferably, prior to the manufacturing process, the leadframe is plated with NiPd and the leads of the leadframe are pre-formed and configured, as can be seen in FIGS. 7A and 7B. Thus, the manufacturing process will proceed as outlined above, but the steps of plating the leads with solder and configuring the leads is no longer required.

Accordingly, by providing leadframes for the manufacture of a chip device in accordance with the present invention wherein the leadframes are pre-plated and/or the leads are pre-formed, the manufacturing process may be simplified and shortened. This allows for a quicker, more efficient and less expensive manufacturing process to be realized.

Die 12 may be manufactured in a conventional manner generally known in the art for a number of applications.

Thus, the present invention provides a chip device that includes a thinner package, that can accommodate a larger die by using a single leadframe and using the back metallized surface of the die as drain contacts. Indeed, up to a 70% increase in die area over wire-bonded parts may be realized Furthermore, the present invention provides a simplified manufacturing process, especially in the embodiments where pre-plated and preformed leadframes are provided.

Although the invention has been described with reference to specific exemplary embodiments, it will be appreciated that it is intended to cover all modifications and equivalents within the scope of the appended claims.

What is claimed is:

1. An assembly comprising:
    a semiconductor die package comprising a leadframe, a semiconductor die that includes a backside including a first electrical terminal and a frontside including a second electrical terminal, wherein the first electrical terminal and the second electrical terminal are terminals in an electrical device, wherein the semiconductor die is mounted on the leadframe, and a body comprising a molding material covering at least a portion of the semiconductor die and at least a portion of the leadframe, wherein the body has a window and an exterior surface, wherein the backside of the semiconductor die is exposed through the window of the body and wherein the backside is substantially flush with the exterior surface of the body; and
    a circuit board, wherein the backside of the semiconductor die is directly attached to the circuit board.
2. The assembly of claim 1 wherein first electrical terminal is a drain terminal.
3. The assembly of claim 1 wherein the leadframe has leads that extend laterally away from the molding material.
4. The assembly of claim 1 wherein the second electrical terminal is a source terminal or a gate terminal.
5. The assembly of claim 1 wherein the leadframe is pre-plated.
6. The assembly of claim 1 wherein the semiconductor die is mounted to the leadframe with solder.
7. The assembly of claim 1 wherein the leadframe has leads that have surfaces substantially coplanar with the backside of the semiconductor die.
8. The assembly of claim 1 wherein the leadframe includes two die attach pads.
9. The assembly of claim 8 wherein the semiconductor die is a first semiconductor die and the semiconductor die package comprises a second semiconductor die, wherein the first and second semiconductor dies are attached to the two die attach pads of the leadframe.

* * * * *